United States Patent
Frischknecht

(10) Patent No.: US 8,330,360 B2
(45) Date of Patent: Dec. 11, 2012

(54) LIGHT-EMITTING DEVICE WITH SUPPORTED COVER

(75) Inventor: Kyle D. Frischknecht, Goleta, CA (US)

(73) Assignee: Osram Opto Semiconductors GmbH, Regensburg (DE)

( * ) Notice: Subject to any disclaimer, the term of this patent is extended or adjusted under 35 U.S.C. 154(b) by 104 days.

(21) Appl. No.: 11/961,896

(22) Filed: Dec. 20, 2007

(65) Prior Publication Data

US 2008/0224601 A1 Sep. 18, 2008

(30) Foreign Application Priority Data

Dec. 29, 2006 (DE) .......................... 10 2006 061 943

(51) Int. Cl.
*H01J 1/62* (2006.01)

(52) U.S. Cl. .......................... 313/512; 313/506; 313/509

(58) Field of Classification Search .......... 313/495–497, 313/498–512
See application file for complete search history.

(56) References Cited

U.S. PATENT DOCUMENTS

| | | | |
|---|---|---|---|
| 4,763,225 A | 8/1988 | Frenkel et al. | |
| 5,175,395 A | 12/1992 | Moore | |
| 5,455,456 A | 10/1995 | Newman | |
| 5,623,394 A * | 4/1997 | Sherif et al. | 361/705 |
| 6,400,014 B1 | 6/2002 | Huang et al. | |
| 6,949,880 B1 | 9/2005 | Guenther et al. | |
| 7,329,560 B2 | 2/2008 | Gramann et al. | |
| 2002/0149035 A1 | 10/2002 | Yamada et al. | |
| 2003/0026077 A1 | 2/2003 | Wennemuth et al. | |
| 2003/0062518 A1 | 4/2003 | Auch et al. | |
| 2003/0094691 A1 | 5/2003 | Auch et al. | |
| 2003/0160318 A1 | 8/2003 | Guenther et al. | |
| 2004/0027066 A1 | 2/2004 | Park et al. | |
| 2004/0048033 A1 | 3/2004 | Klausmann et al. | |
| 2004/0051449 A1 | 3/2004 | Klausmann et al. | |
| 2005/0023629 A1 | 2/2005 | Ding et al. | |
| 2005/0269926 A1 * | 12/2005 | Fukuoka et al. | 313/123 |
| 2006/0076886 A1 * | 4/2006 | Ahn | 313/512 |
| 2006/0093795 A1 | 5/2006 | Wang et al. | |
| 2006/0125375 A1 * | 6/2006 | Hwang et al. | 313/496 |
| 2006/0128042 A1 | 6/2006 | Gramann et al. | |
| 2006/0273304 A1 | 12/2006 | Cok | |
| 2008/0180923 A1 | 7/2008 | Grespan | |

FOREIGN PATENT DOCUMENTS

| | | |
|---|---|---|
| DE | 91 00 665.1 | 7/1992 |
| DE | 101 37 619 | 2/2003 |
| DE | 102 00 382 | 7/2003 |
| JP | 61-32807 | 2/1986 |

(Continued)

OTHER PUBLICATIONS

Silvio Grespan, "Encapsulated Electronic Device", U.S. Appl. No. 11/766,028, filed Jun. 20, 2007, 26 pp.

(Continued)

*Primary Examiner* — Bumsuk Won
(74) *Attorney, Agent, or Firm* — Fish & Richardson P.C.

(57) ABSTRACT

A light-emitting device is described with a flat light-emitting element on a substrate and is encapsulated under a cover. The cover is supported by at least one support element in a central section at a distance from the edge of the light-emitting element. Further provided are indentations in the surface facing the light-emitting element, in which is a cavity containing a getter material. At the boundary, the cover is sealed to the substrate with a sealing compound.

32 Claims, 2 Drawing Sheets

FOREIGN PATENT DOCUMENTS

| | | |
|---|---|---|
| JP | 62-145336 | 6/1987 |
| JP | 6-45470 | 2/1994 |
| JP | 8-274208 | 10/1996 |
| JP | 2000-36384 | 2/2000 |
| JP | 2001-269900 | 10/2001 |
| JP | 2002-319710 | 10/2002 |
| JP | 2004-227792 | 8/2004 |
| JP | 2005-166315 | 6/2005 |
| JP | 2006-99069 | 4/2006 |
| WO | WO 92/13318 | 8/1992 |
| WO | WO 98/50949 | 11/1998 |
| WO | WO 99/35681 A1 | 7/1999 |
| WO | WO 03/058713 | 7/2003 |
| WO | WO 2006/100444 A1 | 9/2006 |
| WO | WO 2006/101378 | 9/2006 |

OTHER PUBLICATIONS

Dinh, Tuan T., "Non-Final Office Action", U.S. Appl. No. 11/766,028, mailed on Aug. 6, 2010 (11 pages).

Dinh, Tuan T., "Final Office Action", U.S. Appl. No. 11/766,028, mailed on Mar. 22, 2011 (10 pages).

Ding, Tuan T., "Office Action", U.S. Appl. No. 11/766,028, mailed on Feb. 2, 2012 (9 pages).

Japan Patent Office, "Translation of the Notification of Reasons for Refusal (type I office action)", JP Appl. No. 2008-12748, issued on Jun. 16, 2011 (4 pages).

* cited by examiner

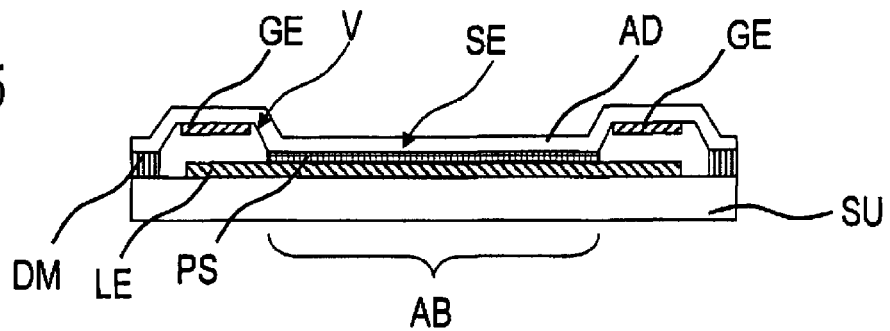
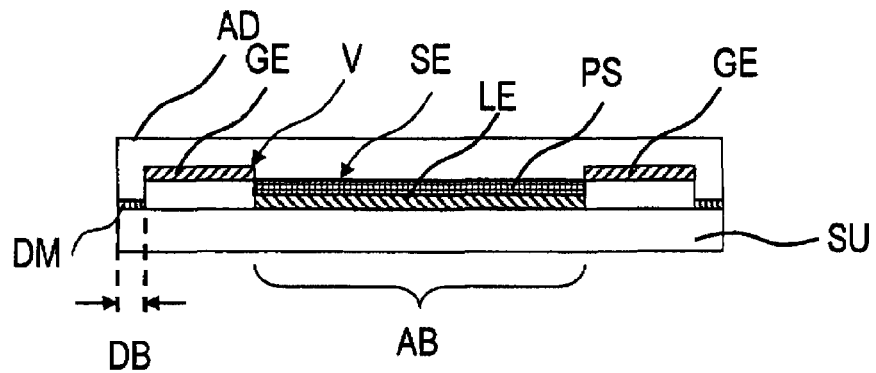
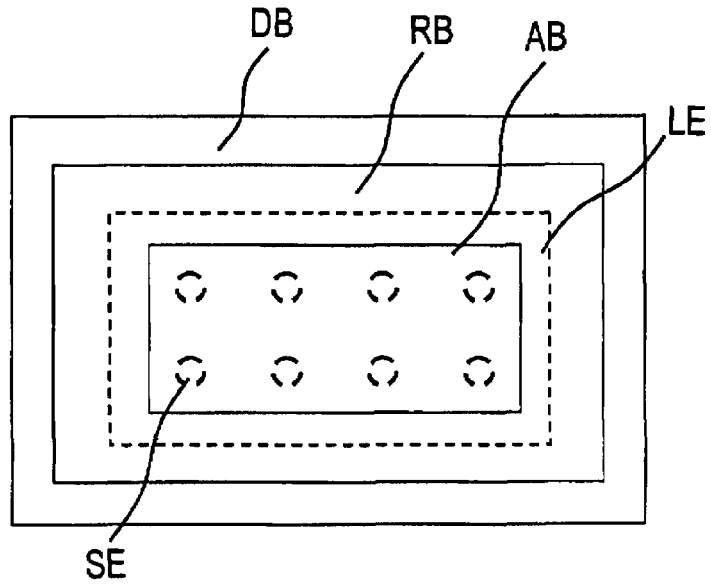

LIGHT-EMITTING DEVICE WITH SUPPORTED COVER

A light-emitting device, which can be used as a lighting component or as a display, is described.

BACKGROUND

Flat light-emitting elements may be implemented, in particular, in the form of electroluminescent layers, as light-emitting diodes or as organic light-emitting diodes (OLEDs). Such light-emitting elements are usually deposited onto a substrate and encapsulated with a cover.

FIG. 1 shows a conventional encapsulation used in particular for OLEDs devices. The device includes a substrate SU, on which a light-emitting element LE, e.g., a flat OLED, is located. Using an elastic sealing and adhesive compound DM, a flat, solid cover AD is glued on top of this configuration. A light-emitting element with such encapsulation has the advantage that the light-emitting element and the cover are scalable, i.e., they can be configured to any size. In addition, the encapsulation is not compressible and therefore generally insensitive to pressure. The weak points of this encapsulation, however, are the boundary surfaces leading to the OLED between the cover and the substrate, along which paths for the diffusion of oxygen and/or moisture are created, which may corrode susceptible OLEDs. Mostly affected by oxygen and moisture are either the metallic electrodes or the organic functional layers.

In addition, larger devices with a diagonal diameter of more than five centimeters and with a thin material thickness, e.g., up to 0.7 millimeters, for example, have a degree of flexibility, which may not provide a sufficiently tight connection between the different material layers, and therefore lead to corrosion or damage. Additional harmful effects may be caused in the event of temperature changes or changes in air pressure as may be the case during transportation in airplanes. As a result, the adhesive or sealing compound DM may delaminate or the substrate, which is usually made of glass, may break.

FIG. 2 shows another conventional encapsulation used in particular for OLEDs. In contrast to FIG. 1, FIG. 2 shows a cover AD having a clearance above the light-emitting element LE, therefore covering the component without touching it. The cover is seated all around the substrate SU and joined to it with a sealing compound DM. The sealing compound DM is here limited to a bearing area of the cover, which here is the same as the sealed section. Furthermore, the inside of the cover may have, at a distance from the light-emitting element a getter material GE, which is able to absorb and/or bind oxygen and/or moisture. This prevents damage to the OLED should harmful substances enter the device. In this embodiment, the edges of the encapsulation are protected better due to the absence of a straight diffusion path between adjacent boundary layers leading to the OLED, allowing a longer lifecycle for the encapsulated light-emitting element. However, this type of package has the disadvantage that the self-supporting cover becomes increasingly sensitive to compression as the surface area increases, and therefore sensitive to mechanical or ambient air pressure, which may result in the direct contact of the getter material with the OLED or the damages associated with the configuration in FIG. 1. The encapsulation according to FIG. 2 is therefore not suited for light-emitting elements with a large surface.

SUMMARY

A light-emitting device is provided with a scalable surface without having to deal with the hazards of leakage or damage to the device.

BRIEF DESCRIPTION OF THE FIGURES

In the following, the invention is explained based on embodiments and their associated figures. The figures are used for demonstration purposes only and are schematically correct but not true to scale.

FIG. 5 shows an embodiment with an embossed cover, FIG. 6 shows an embodiment with cover opened at the seal, FIG. 7 shows an element viewed from the top.

DETAILED DESCRIPTION

Figure 1:
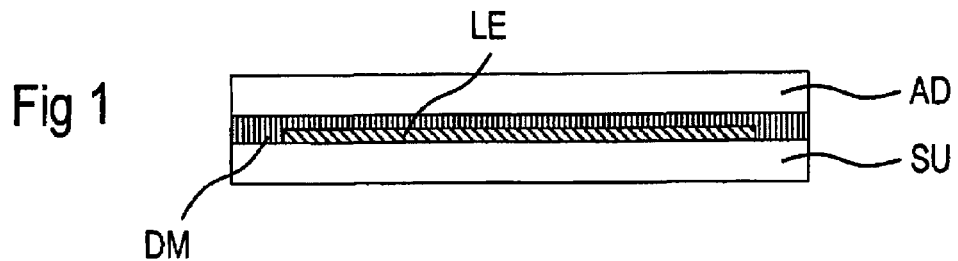
FIG. 1 shows a cross-sectional view of a conventional encapsulation for a light-emitting element.
Figure 2:
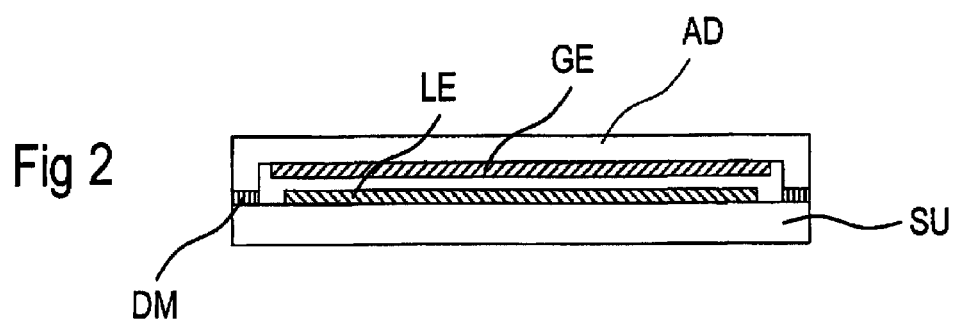
FIG. 2 shows a cross-sectional view of another conventional light-emitting element.

Proposed is a light-emitting device, which combines the advantages of the two conventional encapsulations (as shown in FIGS. 1 and 2) while simultaneously avoiding their disadvantages. The device comprises a substrate, on which a flat, light-emitting element is configured. Located above is a cover, which ensures that the light-emitting element is tightly sealed between the substrate and the cover. The inside of the cover is an indentation opening up toward the light-emitting element, and which together with the light-emitting element encloses a cavity. Inside the cavity, a getter material is located on the cover. The cover also has at least one support element, which supports the cover in a central location at a distance from the light-emitting element.

As a result, a device is provided where indentations in the cover create clearances above the light-emitting element. Due to the at least one central support element above the light-emitting element the disadvantages otherwise associated with a self-supporting cover, as shown in FIG. 2, are avoided. The at least one support element reduces the number of surfaces that need to be bridged by a self-supporting cover. The clearances created above the light-emitting element are filled with the getter material, which prevents or at least delays over a longer period of time any damage to the light-emitting element caused by entering moisture and/or oxygen.

The proposed device can be scaled to any size since the support elements avoid the need for larger self-supporting sections of the cover.

In one embodiment, the light-emitting element is an organic radiation-emitting component, such as an organic light-emitting diode (OLED), which is especially sensitive to moisture and oxygen. An OLED may have an organic layer or a series of layers with at least one organic layer with one active domain, which in operating mode emits electromagnetic radiation.

An OLED may furthermore have a first electrode and a second electrode, whereby the active domain of the organic layer or series of layers with at least one organic layer is located between the first and the second electrode. The first and the second electrodes may be suitable to inject "holes" or electrons into the active domain, where they can recombine under emission of electromagnetic radiation.

The first electrode may furthermore be located on the substrate. Deposited above the first electrode may be the organic layer or the series of layers with one or multiple functional layers of organic materials. The functional layers, which may include the active domain, may be electron-transporting layers, electroluminescent layers and/or hole-transporting layers. The second electrode is deposited above the functional layers or the at least one organic layer.

The cover and the substrate are joined by a sealing compound, which is located near the edge of the cover all around the circumference of the sealed section and which seals the outer gap between the cover and the substrate. The surface of the light-emitting element can be smaller than the cover so that the light-emitting element is located inside an area that is sealed off.

The substrate may be formed of glass, quartz, plastic film, metal, metal foil, a silicon wafer or any other suitable substrate material. The substrate can also be configured as a series of layers or a laminate of multiple layers. If the organic radiation-emitting component is a so-called "bottom emitter", i.e., if the electromagnetic radiation generated in the active domain is emitted through the substrate, the substrate is advantageously transparent for at least part of the electromagnetic radiation.

In the bottom emitter configuration, the first electrode on the substrate may be transparent to at least part of the electromagnetic radiation. A transparent first electrode, which may be configured as an anode and thus may function as a material that can be used to inject positive charges or "holes" may contain a transparent conductive oxide or may be made of a transparent conductive oxide. Transparent conductive oxides ("TCOs") are transparent, conductive materials—usually metal oxides such as zinc oxide, tin oxide, cadmium oxide, titanium oxide, indium oxide or indium-titanium oxide (ITO). In addition to binary metal-oxygen compounds such as $ZnO$, $SnO_2$ or $In_2O_3$ they also include ternary metal-oxygen compounds such as $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides of the TCO group. Furthermore, it is not imperative for the TCOs to have a stoichiometric composition, and they may also be p- or n-doped. Alternatively or in addition, the first electrode may also contain a metal such as silver, for example.

The series of layers with at least one organic layer may have polymers, oligomers, monomers, organic small molecules or other organic non-polymer compounds or combinations thereof.

In particular, it may be advantageous for one functional layer of the series of layers to be a hole-transporting layer to allow effective hole injection into an electro-luminescent layer or electroluminescent domain. The materials, architecture, function and structures regarding the active domain and the other layers and domains are known to the professional and will therefore not be explained in detail.

The second electrode may be a cathode and would therefore serve as electron-injecting material. Advantageous cathode materials are, in particular, aluminum, barium, indium, silver, gold, magnesium, calcium or lithium as well as compounds, combinations and alloys thereof. In addition or alternatively, the second electrode may also be transparent. This means in particular, that the OLED may also be configured as a "top emitter", i.e., that the electromagnetic radiation generated in the active domain can be emitted from the side of the organic radiation-emitting component facing away from the substrate.

If an electrode having or being made of a metallic layer is designed to be transparent to the light being emitted from the organic stack of layers, it may be advantageous for the metallic layer to be sufficiently thin. The thickness of such a semi-transparent metallic layer can be between about 1 nm and 100 nm.

Furthermore, the first electrode may be a cathode and the second electrode may be an anode, whereby the organic radiation-emitting component can be designed as a bottom emitter or a top emitter. The organic radiation-emitting component can also be designed as a top and bottom emitter.

Advantageously, the substrate and/or the cover include a glass layer. Glass has the advantage of being transparent to the emitted radiation, economical, easy to process, diffusion-safe, and sufficiently mechanically stable. At least one of the substrate and the cover may include additional layers, and may be configured as a multi-layer laminate. At least one of the substrate and cover is at least partially transparent to the light radiated from the light-emitting element.

The cavity with the getter material is directly adjacent to the sealed area and extends like the sealed area to a periphery of the device in all lateral directions, therefore following the rim of the cover. This has the advantage that the getter material is located closely to any possible diffusion paths, where oxygen and/or moisture may potentially enter the component.

The outer limit of the light-emitting element can be located at a sufficient distance from the seal. The cavity may extend at least across the area defined by this distance, causing the getter material to be located at the same distance. The getter material is then—following the entering path of corroding substances—located in front of the light-emitting element and is able to absorb these substances and render them harmless before they reach the light-emitting element.

The getter material is preferably an oxidizable material that is able to react with oxygen and moisture and able to bind these hazardous materials, or zeolite. Easily oxidizable materials are, in particular, metals from the group of alkali and alkaline earth metals. Other metals such as titanium or oxidizable non-metallic materials are suitable as well. Suitable getter materials are known in sufficient numbers in the state of the art, and therefore do not need to be listed in detail.

In some embodiments, the device is designed with one single support element, which is placed at the center of a supporting area covering the larger surface of the light-emitting element. Located between the support element and the light-emitting component is a buffer layer, which may include an organic and/or inorganic material. The supporting area can therefore cover nearly the entire surface of the light-emitting element. In some embodiments, only a narrow edge of the light-emitting element remains around the periphery of the supporting area, the narrow edge extending outside the supporting area into the cavity created by the indentation.

In some embodiments, the supporting area covers the entire surface of the light-emitting element, so that this surface is fully covered by the buffer layer and the support element is seated on top of the buffer layer. This embodiment has the advantage of evenly distributing the mechanical load of the light-emitting element, preventing the danger of local functional changes due to a load differences or an only locally seated cover.

The central support element and a ring-shaped indentation enclosing it can be created separately. Advantageous is a cover where the single central support element is defined or structured by a closed ring-shaped indentation. Another option is the addition of additional recesses or indentations in the cover and to fill them with getter materials as well.

The sealing compound in the sealed section and the buffer layer between the support element and the light-emitting element can be made of the same material. Suitable materials for the sealing compound are reaction resins, which facilitate the creation of an adhesive and sealed joint. The reaction resins may be single-component or multi-component resins, which are cured with heat or with light or a combination of both. Suitable materials can be found in the class of epoxides, which can be used as sealing compounds and as adhesives.

It is also possible to make the sealing compound and the buffer from different materials, whereby the materials will be selected according to their intended purpose. While for the sealing compound a material with good adhesion, high moisture-resistance and good mechanical molding material properties is advantageous, these characteristics are of no importance to the buffer. For the buffer layer, a soft and elastic material can be used, which does not need to have adhesive properties.

In some embodiments, the side of the cover facing the substrate contains a layer of glass with at least one indentation. The indentation can be embossed into one side, so that the opposite surface of the glass is planar. It is also possible to emboss the indentations such that the indentation results in a corresponding bulge on the other side the glass layer. The stamping of the glass takes place during the manufacture of the cover while the glass layer is softened.

Another option is for the desired indentations to be etched into the glass layer. Etching has the advantage that the cover can be structured with high accuracy, which is particularly important for the exact positioning and the dimensioning of the single or multiple support elements.

It is in any case advantageous for the at least one support element to be made of the same material as the cover, and to be an integral component thereof. Alternatively, the support element can be glued, cast or welded to the cover.

The at least one support element can also be joined to the cover by gluing, casting or welding. The support element is then made separately and joined to the cover. This design is advantageous when multiple support elements are used, which are evenly distributed across the cover. The support elements can also be distributed unevenly across the support area without any disadvantages regarding the transparency or mechanical stability of the device.

The support elements can have any shape. In some embodiments, they have a cross-section, which tapers in the direction of the light-emitting element. That is, a cross-section of a support element is less at a portion closer to the light-emitting element than to a portion closer to an exterior of the cover. This has the advantage that the multiple support elements have the smallest possible footprint in the supporting area. Should the function of the light-emitting element be impacted by the bearing pressure of the support element, only a minimum area of the light-emitting element will be affected. A minimum bearing area per support element has furthermore the advantage that in combination with a structured light-sensitive element the support elements are supported by the structuring edges of the light-sensitive element, which do not actively emit light and which therefore also have a minimum structural width. This means that the active diode surface of the light-emitting element, which may be an OLED, is not affected by the support elements.

The light-sensitive element is structured in such fashion that sections are created which can be driven electrically independently of each other. These partitions can be as small as needed, whereby simultaneously a minimum size of the partitions with a maximum number of independent partitions can be used to achieve a high-resolution image with the independently controllable partitions of the light-emitting element.

In some embodiments, the cover has at the seal on the surface facing the substrate a circular bead all around, which is raised at least over the indentations. In some embodiments, the bead is not circular, but is another closed shape that surrounds the perimeter of the light-emitting element, such as rectangular. The surface of the bead then comprises the seal and is plane-parallel in order to achieve an optimum seal with the substrate. The difference in height between the bead surface relative to the supporting surface of the support elements is set to a value, which at a maximum is equal to the elevation of the light-emitting element above the surface of the substrate. By selecting these dimensions accordingly, a minimum layer thickness is required in the sealed section, resulting in a greater impermeability and therefore better protection against corrosion from moisture and/or oxygen. In some embodiments, the bead is formed on the substrate, rather than on the cover. The bead can be any structure that surround the active area and defines in part the indentation V or cavity.

Figure 3:
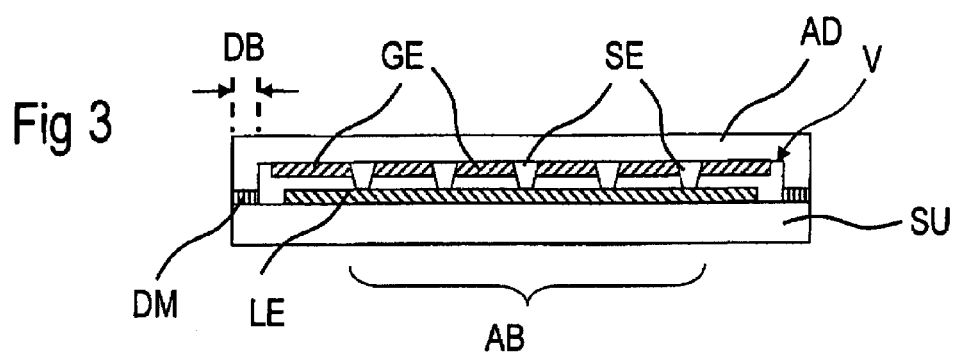
FIG. 3 shows a first embodiment of a light-emitting element with distributed support elements.

FIG. 3 shows the proposed, improved device, where the cover AD is positioned on the light-emitting element LE with the help of support elements SE, which are an integral part of the cover. The support elements SE may be attached at equal distances to a supporting area AB, for example. Applied to the inside of the cover AD between the support elements is a getter material GE. The support elements can have any desired shape, such as conical. The support elements SE can each have the same shape or different shapes. In this embodiment, the cover AD has only one single indentation V interrupted by the support elements SE. In the outer area, which is equal in width to the sealed section DB, the lower edge of the cover is planar with the lower edge of the support elements SE. Some embodiments may deviate from this configuration, depending on the thickness of the sealing compound between the cover AD and the substrate SU.

Figure 4:
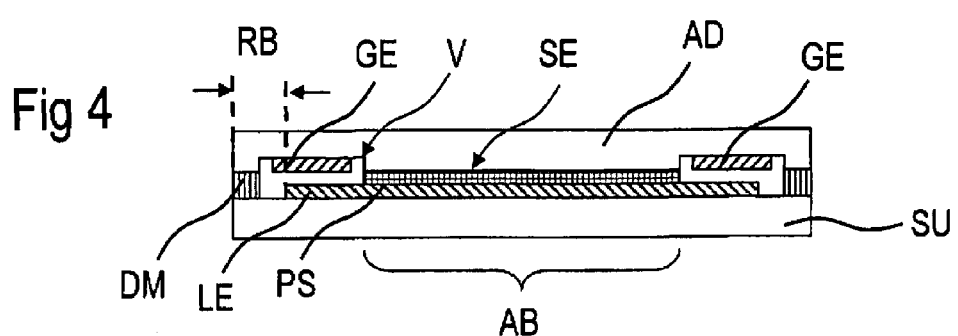
FIG. 4 shows another embodiment with a central, large-surface support element.

FIG. 4 shows another embodiment of a device according to the invention, where the cover AD is positioned at the center of a supporting section AB on the light-emitting element LE.

The supporting area AB covers large part of the surface of the light-emitting element LE. The cover has on both sides of the support element SE an indentation V, which can enclose the central support element SE, such as in the shape of a ring or other non-circular but hollow shape, that is, a shape that forms a closed perimeter. Located inside the indentation is a getter material GE in such fashion as not to touch the light-emitting element, in particular, the OLED.

The substrate SU has a border area RB, which encloses the light-emitting element LE. Inside this border but at a distance to the outer edge of the light-emitting element LE is the sealed section DB (not shown in FIG. 4) containing a sealing compound DM between the cover AD and the substrate SU, which seals the gap between the two elements forming the encapsulation. Located between the central support element SE and the light-emitting element LE is a buffer layer PS contacting the support element SE as well as the light-emitting element LE.

The indentation V is located close to the seal or right next to it, and may be located completely inside the border RB. Another option is, as shown in FIG. 4, for the light-emitting element LE to extend into the indentation V. The surface of the cover AD facing away from the light-emitting element LE may also be planar.

In some embodiments, there are areas of separation between light-emitting elements LE. The support elements SE are in the areas of separation and thus do not contact the light-emitting elements LE. In some embodiments, the support elements SE are located in areas of the light-emitting elements LE that are inactive. The areas that are free of light-emitting elements or of active portions of the light-emitting elements can be referred to as structured areas. Because the support elements SE are located in these areas in these embodiments, the support elements SE do not damage the light emitting area.

FIG. 5 shows an embodiment where the cover AD includes at least one glass layer, into which the indentations V have been embossed. The embossing can be done while the glass layer is in the fluid or softened state. The glass layer may be a thin glass foil.

The indentations V can also be embossed by casting a glass foil into an accordingly designed glass mold.

The cover or the glass layer of the cover may furthermore be of a uniform thickness. It is also possible to cast the foil in such manner that the surface facing away from the light-emitting element LE is plane. Alternatively, the indentations V in the glass layer can be created by post-structuring, for example through etching or embossing. In the embodiment according to FIG. 3 with multiple support elements distributed across the support section AB, the structuring of the indentation can be combined with the structuring of the support elements SE. Or, the support elements may be indented afterwards.

FIG. 6 shows an embodiment with two additional details, which independently may be combined with the embodiments shown in the other Figs. In this case, the support element has a bearing area AB, which takes up the entire support section and approximately matches the footprint of the light-emitting element LE, so that the light-emitting LE is completely covered by the buffer layer and the support element.

FIG. 7 shows a top view of a potential distribution of the footprints of a light-emitting device according to the invention. The sections and the borders are concentric, whereby the general basic shape of the light-emitting device may have any type of contour, such as rectangular or round. Looking from the outside in, the outer edge of the cover AD is followed by the sealed section DB.

Directly following the sealed section DB is the border are RB, which is free of light-emitting element. The border area RB is between light-emitting element LE and sealed section DB. Further to the inside and at a distance from the sealed section DB is the support section AB inside which either a central support element SE is seated on the light-emitting element LE or inside which individual, smaller support elements SE are distributed across the support section AB. The indentation can follow the sealed section DB and overlaps at least partially the border area RB. The outer edge of the light-emitting element LE (shown in a dotted line) follows the border but can also coincide with the support section AB or its outer boundary.

Only a few embodiments are described herein, however, the device is not limited to the embodiments presented here. Rather, it is possible to combine the individual characteristics in the individual embodiments with the characteristics shown in other embodiments. The exact design of the indentation, the support elements, their dimensions, the number of support elements and their distribution may differ from the embodiments shown in the Figs. Any information about the materials for the individual elements provided here is not binding. In particular, it is possible to use known materials for individual components of the device to the extent as they match known devices.

What is claimed is:

1. A light-emitting device, comprising:
a substrate having a flat light-emitting element;
a cover, wherein the light-emitting element is sealed between the substrate and the cover, the cover having at least one indentation facing the substrate and which together with the substrate encloses a cavity;
a getter material inside the cavity, on the cover; and
at least one support element in a central support section at a distance from an edge of the light-emitting element, wherein
the at least one support element and cover are formed of the same material, the at least one support element is an integral component of the cover and any active region of the light-emitting element is not contacted by the support element, the at least one support element is located in an inactive area of the light-emitting element and the light-emitting element is continuous and extends below the at least one support element in a direction toward the substrate.

2. The device according to claim 1, wherein the light-emitting element is an OLED.

3. The device according to claim 1, wherein between the cover and the substrate at the outer edge of the cover is a sealed section, which is free of the light-emitting element and wherein in the sealed section is a sealing compound, which seals the cover to the substrate.

4. The device according to claim 3, wherein the cavity is located directly next to the sealed section.

5. The device according to claim 3, wherein the support element is seated at the center of the central support section, the device further comprising an organic, inorganic or mixed buffer layer in the support section between the support element and the light-emitting element.

6. The device according to claim 5, wherein the support section is located at a distance from the outer edge of the light-emitting element along an entire boundary, wherein located in the boundary between the sealed section and the support section is the indentation, which defines the cavity.

7. The device according to claim 5, wherein the sealing compound and the buffering layer consist of the same material.

8. The device according to claim 1, wherein the substrate and the cover each include a glass layer.

9. The device according to claim 1, wherein the getter material is an oxidizable material, which reacts with and binds oxygen and moisture.

10. The device according to claim 1, wherein the substrate is at least partially transparent to the light emitted by the light-emitting element.

11. The device according to claim 1, wherein the cover includes a glass layer, into which the at least one indentation has been embossed.

12. The device according to claim 1, wherein multiple support elements are distributed at equal distances across the cover.

13. The device according to claim 12, wherein the support elements have a cross-section that tapers in the direction of the light-emitting element.

14. The device according to claim 1, wherein the light-emitting element is structured into partitions, which are configured to be electrically driven independently of each other.

15. The device according to claim 14, wherein the partitions have structuring areas that are unable to emit light and the support elements are located in the area of the structuring areas.

16. The device according to claim 1, wherein the cover has on a side facing the substrate a glass layer, into which a plurality of indentations are etched, forming a plurality of support elements.

17. The device according to claim 1, wherein the cover has around the sealed section on the surface facing the substrate a bead, which is at least raised above the at least one indentation.

18. The device according to claim 17, wherein the bead extends further from a main surface of the cover than the support elements.

19. A light-emitting device, comprising:
a substrate having a flat light-emitting element;
a cover, wherein the light-emitting element is sealed between the substrate and the cover, the cover having at least one indentation facing the substrate and which together with the substrate encloses a cavity;
a getter material inside the cavity, on the cover; and
at least one support element in a central support section being seated at the center of the central support section, the device further comprising an organic, inorganic or mixed buffer layer in the support section between the at least one support element and the light-emitting element, wherein the at least one support element has a bearing area disposed along the entire support section and substantially matching the footprint of the light-emitting element and the light-emitting element is completely covered by the buffer layer and the at least one support element.

20. The device according to claim 19, wherein the light-emitting element is an OLED.

21. The device according to claim 19, wherein between the cover and the substrate at the outer edge of the cover is a sealed section, which is free of the light-emitting element and wherein in the sealed section is a sealing compound, which seals the cover to the substrate.

22. The device according to claim 21, wherein the cavity is located directly next to the sealed section.

23. The device according to claim 21, wherein the support element is seated at the center of the central support section, the device further comprising an organic, inorganic or mixed buffer layer in the support section between the support element and the light-emitting element, wherein the support section is located at a distance from the outer edge of the light-emitting element along an entire boundary, wherein located in the boundary between the sealed section and the support section is an indentation, which defines the cavity.

24. The device according to claim 21, wherein the support element is seated at the center of the central support section, the device further comprising an organic, inorganic or mixed buffer layer in the support section between the support element and the light-emitting element, wherein the sealing compound and the buffering layer consist of the same material.

25. The device according to claim 19, wherein the substrate and the cover each include a glass layer.

26. The device according to claim 19, wherein the getter material is an oxidizable material, which reacts with and binds oxygen and moisture.

27. The device according to claim 19, wherein the substrate is at least partially transparent to light emitted by the light-emitting element.

28. The device according to claim 19, wherein the cover includes a glass layer, into which the at least one indentation has been embossed.

29. The device according to claim 19, wherein the at least one support element is made of the same material as the cover, and is an integral component of the cover.

30. The device according to claim 19, wherein the at least one support element is joined to the cover by gluing, casting, or welding.

31. The device according to claim 19, wherein the cover has around the sealed section on the surface facing the substrate a bead, which is at least raised above the at least one indentation.

32. The device according to claim 31, wherein the bead extends further from a main surface of the cover than the support elements.

* * * * *